United States Patent [19]

Bushey et al.

[11] Patent Number: 4,810,903
[45] Date of Patent: Mar. 7, 1989

[54] BICMOS DRIVER CIRCUIT INCLUDING SUBMICRON ON CHIP VOLTAGE SOURCE

[75] Inventors: Thomas P. Bushey, Phoenix; Walter C. Seelbach, Fountain Hills, both of Ariz.

[73] Assignee: Motorola, Inc., Schaumburg, Ill.

[21] Appl. No.: 132,843

[22] Filed: Dec. 14, 1987

[51] Int. Cl.$^4$ .................. H03K 19/02; H03K 17/16; H03K 19/094
[52] U.S. Cl. ........................ 307/446; 307/443; 307/448; 307/451; 307/570
[58] Field of Search .............. 307/443, 446, 448, 570, 307/451

[56] References Cited

U.S. PATENT DOCUMENTS

| | | | |
|---|---|---|---|
| 3,440,551 | 4/1969 | Narud et al. | 307/270 |
| 3,541,353 | 11/1970 | Seelbach et al. | 307/446 |
| 4,103,188 | 7/1978 | Morton | 307/446 |
| 4,616,146 | 10/1986 | Lee et al. | 307/446 |
| 4,751,410 | 6/1988 | Tanizawa | 307/570 |

OTHER PUBLICATIONS

I.B.M. Tech. Disc., "Complementary FET Bipolar Circuit".

Primary Examiner—John S. Heyman
Assistant Examiner—Margaret Rose Wambach
Attorney, Agent, or Firm—William E. Koch

[57] ABSTRACT

A BICMOS driver circuit is provided having high input impedance and high output current drive with low static power dissipation that provides supply voltages and full logic output voltage swing for circuits having submicron dimensions. An inverter circuit is coupled to a voltage divider circuit and the input terminal for inverting the input signal. A complementary emitter follower circuit is coupled to an output terminal for providing a digital output signal. A current source circuit is coupled to the complementary emitter follower circuit and the input terminal for sourcing current to the complementary emitter follower circuit in response to the input signal. A bipolar bias circuit is coupled to the complementary emitter follower circuit and the inverter circuit for biasing the complementary emitter follower circuit in response to an inverted input signal.

15 Claims, 1 Drawing Sheet

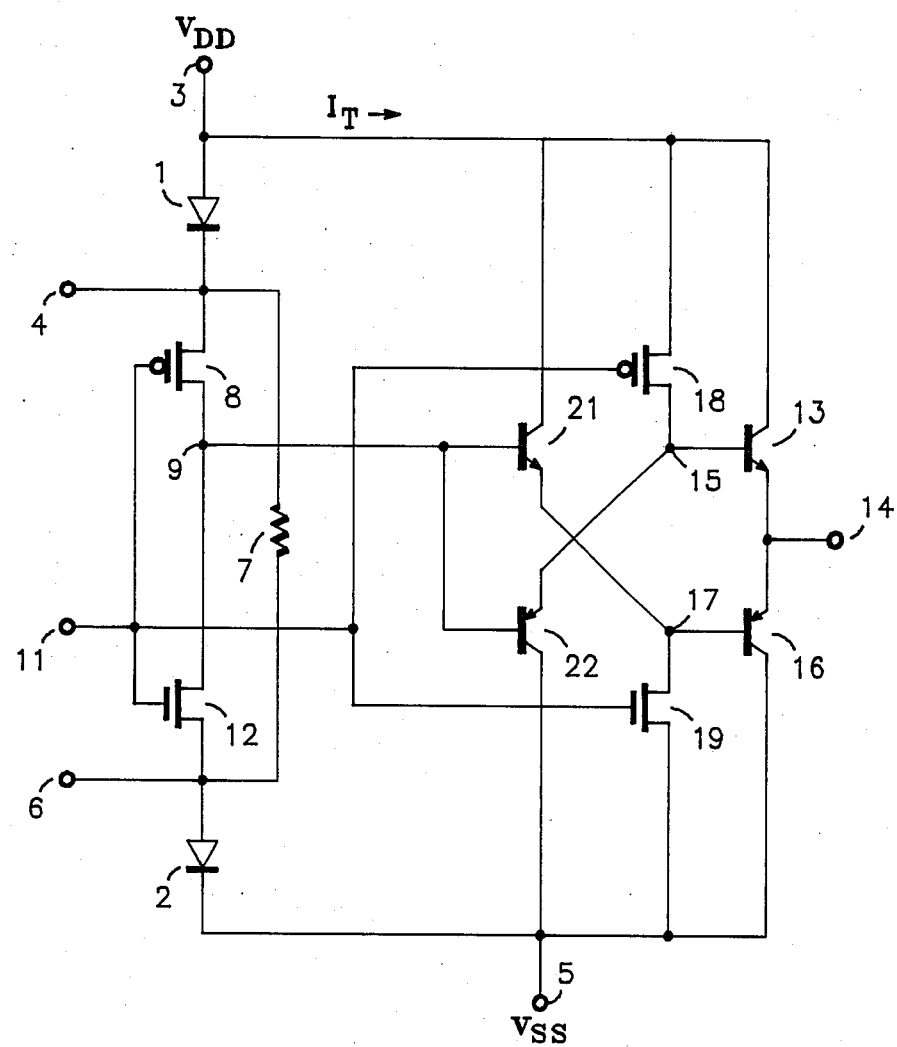

4,810,903

BICMOS DRIVER CIRCUIT INCLUDING SUBMICRON ON CHIP VOLTAGE SOURCE

FIELD OF THE INVENTION

This invention relates in general to a BICMOS circuit and, more particular, to an an on-chip voltage source and output driver circuit having high input impedance and high output current drive capability that provides full logic output voltage swing for circuits having submicron dimensions.

BACKGROUND OF THE INVENTION

In many applications of logic circuits, it is essential that the logic circuit have a suitable fanout (ability to drive a large number loads) or equivalent capacitive drive capability. In order to provide sufficient current drive to heavy capacitive loads, an output buffer is coupled between the output of the logic circuit and the load which is to be driven. Conventional output driver circuits comprise a transistor amplifier, usually in the form of an emitter follower, which has a low output impedance, thereby providing high drive capability, reduced delay per unit load, and fast switching speed. BICMOS circuits combine CMOS devices having high input impedance, good noise immunity and low static power dissipation, and bipolar output transistors having low output impedance and excellent current drive capability.

Monolithically integrated CMOS and BICMOS circuits typically operate with a power supply voltage of 5.0 volts. In the case of BICMOS circuits, the bipolar output device is limited to a range of output voltage swing approximated by the power supply voltage minus two base-emitter voltages. CMOS circuits provide output voltage levels equal to the power supply voltage; however, the output impedance is quite high and the current drive is reduced.

In an effort to avoid reliability problems associated with high electric field in the gate-drain region (hot electron effect), CMOS and BICMOS circuits having submicron dimensions typically require a voltage supply not to exceed 3.4 volts. As a consequence, systems designed to operate from a 5.0 volt power supply require modification to accommodate a CMOS or BICMOS circuit with submicron dimensions.

Thus, what is needed is a BICMOS driver circuit having high input impedance and high output current drive that provides the supply voltage and full logic output voltage swing for the submicron circuitry.

SUMMARY OF THE INVENTION

Accordingly, it is an object of the present invention to provide a BICMOS driver circuit Another object of the present invention is to provide a BICMOS driver circuit having improved output signal characteristics.

A further object of the present invention is to provide a BICMOS driver circuit having high input impedance.

Still another object of the present invention is to provide a BICMOS driver circuit having low static power requirements.

Yet another object of the present invention is to provide a BICMOS driver circuit including a voltage source for submicron circuitry.

Another object of the present invention is to provide a BICMOS driver circuit having an output voltage swing substantially as large in magnitude as the voltage source for circuitry having submicron dimensions.

In carrying out the above and other objects of the invention in one form, there is provided a driver circuit comprising a voltage divider coupled between first and second supply voltage terminals for dividing first and second supply voltages thereupon and providing third and fourth supply voltages at third and fourth supply voltage terminals, respectively. A CMOS transistor inverter is coupled to the voltage divider circuit and the input terminal for inverting the input signal. A complimentary emitter follower circuit is coupled between the first and second supply voltage terminals and to an output terminal for providing a digital output signal. A bias circuit is coupled between the first and second supply voltage terminals and is coupled to both the complimentary emitter follower circuit and the inverter circuit for biasing the complimentary emitter follower circuit in response to the inverted input signal. A current source circuit is coupled between the first and second supply voltage terminals and is coupled to both the bias circuit and the input terminal for sourcing current to the bias circuit in response to the input signal.

The above and other objects, features, and advantages of the present invention will be better understood from the following detailed description taken in conjunction with the accompanying drawings.

BRIEF DESCRIPTION OF THE DRAWING

The single FIGURE is a schematic of the present invention.

DETAILED DESCRIPTION OF THE INVENTION

Systems incorporating monolithically integrated circuits (chips) conventionally have used a 5.0 volt power supply for powering the chips. Newer chips designed with technology having submicron dimensions typically require a smaller supply voltage than the 5.0 volt chips. This presents a problem when chips requiring a 5.0 supply voltage and chips requiring the smaller supply voltage are used in the same system. The invention described herein overcomes this problem by providing both the lower supply voltage (submicron supply voltages) and a digital output signal having a voltage swing over the full submicron supply voltage in response to an input signal from the 5.0 volt system.

Referring to the single FIGURE, a BICMOS driver circuit in accordance with the present invention is shown which may be manufactured in monolithic integrated circuit form. Diodes 1 and 2 are coupled between supply voltage terminal 3 and supply voltage terminal 4, and supply voltage terminal 5 and supply voltage terminal 6, respectively, and along with resistor 7 coupled, between terminals 4 and 6, comprise a voltage divider for providing a first submicron supply voltage at terminal 4 and a second submicron supply voltage at terminal 6. Diodes 1 and 2 and resistor 7 are typical elements for performing this function and may alternatively comprise any combination of other elements and may be located in areas of the chip remote from the remainder of the circuit of FIG. 1. The voltage typically applied to supply voltage terminals 3 and 5 are 5.0 volts and ground, respectively, and are referred to as $V_{DD}$ and $V_{SS}$, respectively. The voltage appearing on terminal 4 will be one diode drop below $V_{DD}$, or approximately 4.2 volts, and the voltage appearing on terminal 6 will be one diode drop above $V_{SS}$, or approximately 0.8 volts. This results in a voltage potential between terminals 4 and 6 of approximately 3.4 volts.

MOS transistor 8 (P channel) has a source connected to the cathode of diode 1, a drain connected to node 9, and a gate connected to input terminal 11. MOS transistor 12 (N channel) has a drain connected to node 9, a source connected to the anode of diode 2, and a gate connected to input terminal 11. In this particular application, the P channel transistor 8 will not have "body effect" (back-gate bias) to consider when establishing the threshold voltage, since the bulk may be tied to the 4.2 volt supply. In contrast, the N channel transistor 12 will have "body effect" to consider when establishing desired threshold voltage. Transistors 8 and 12 function as an inverter for inverting an input signal on input terminal 11 and providing an inverted input signal at node 9.

NPN transistor 13 has a collector connected to supply voltage 3, an emitter connected to output terminal 14, and a base connected to node 15. Substrate PNP transistor 16 has an emitter connected to output terminal 14, a collector connected to supply voltage 5, and a base connected to node 17. Transistors 13 and 16 source from output terminal 14 and sink current from output terminal 14, respectively, in response to signals appearing on nodes 15 and 17, respectively.

MOS transistor 18 (P channel) has a source connected to supply voltage 3, a drain connected to node 15, and a gate connected to input terminal 11. MOS transistor 19 (N channel) has a drain connected to node 17, a source connected to supply voltage 5, and a gate connected to input terminal 11. Transistors 18 and 19 serve as current sources for bipolar transistors 21 and 22.

NPN transistor 21 has a collector connected to supply voltage terminal 3, an emitter connected to node 17, and a base connected to node 9. Substrate PNP transistor 22 has an emitter connected to node 15, a collector connected to supply voltage 5, and a base connected to node 9. Transistors 21 and 22 drive transistors 13 and 16 in response to the inverted input signal on node 9.

While this circuit operates on 5.0 volts from the system into which it may be incorporated, a submicron supply voltage of 3.4 volts appears between terminals 4 and 6 that may be provided to other circuits (loads) on chip that are manufactured with the submicron technology. Furthermore, the excellent current drive capability at terminal 14 is available over the entire voltage swing of 3.4 volts. When a logical zero is present at input terminal 11, the voltage on output terminal 14 will swing high to a voltage of one $\phi$ (base-emitter drop of transistor 13) less than the 5.0 volts appearing on terminal 3, or approximately 4.2 volts. For a logical one at input input terminal 11, the voltage on output terminal 14 will swing low to a voltage of one $\phi$ (base-emitter drop of transistor 16) greater than the 0.0 volts appearing on terminal 5, or approximately 0.8 volts. This provides a voltage swing of approximately 3.4 volts, the same as the supply voltage provided by terminals 4 and 6.

When the output at terminal 14 is high (steady state), the emitter current of transistor 21 ($I_{21H}$) and transistor 22 ($I_{22H}$) is as follows:

$$I_{21H} = \text{Beta}_{19}(\phi_D - V_{T19})^2,$$

where
 Beta $= (u/2)(W/L)C_{ox}'$,
 $u/2$ = mobility of transistor 19,
 W/L = gate width over length,
 $C_{ox}'$ = capacitance per unit surface area,
 $\phi_D$ = voltage drop across diodes 1 or 2,
 $V_{T19}$ = threshold of transistor 19.

$$I_{22H} = (\phi_D - \phi_{22})/R_{18},$$

where
 $\phi_{22}$ = transistor 22 base-emitter voltage,
 $R_{18}$ = on resistance of transistor 18 in linear region.

When the output at terminal 14 is low (steady state), the emitter current of transistor 21 ($I_{21L}$) and transistor 22 ($I_{22L}$) is as follows:

$$I_{21L} = (\phi_D - \phi_{21})/R_{19},$$

where
 $\phi_{21}$ = transistor 21 base-emitter voltage,
 $R_{19}$ = on resistance of transistor 19 in linear region.

$$I_{22L} = \text{Beta}_{18}(\phi_D - V_{T18})^2,$$

where
 $V_{T18}$ = threshold of transistor 18.

The average current ($I_{13,16}$) between the emitters of transistors 13 and 16 (where transistors 13 and 21, and 16 and 22, respectively, are matched in accordance with current mirror techniques) is as follows:

$$(I_{13,16}) = \frac{\sqrt{(I_{21H})(I_{22H})} + \sqrt{(I_{21L})(I_{22L})}}{2}$$

Therefore, the average current from $V_{DD}$ less the current through resistor 7 is as follows:

$$I_T = \frac{I_{21H} + I_{22H} + I_{21L} + I_{22L}}{2} + I_{13,16}$$

Furthermore, the current ($I_7$) through resistor 7 may be expressed as follows:

$$I_7 = (V_{DD} - 2\phi_D)/R_7,$$

where
 $R_7$ = resistance of resistor 7,
 $\phi_D = (kT/q)\ln(I_D/I_S)$,
 k = Boltzmann's constant,
 T = absolute temperature,
 q = electronic charge,
 $I_S$ = saturation current.

Therefore, it is seen that $\phi_D$ may be adjusted by setting the current through resistor 7 ($I_7$), thereby setting $I_T$.

As a result, the average current from $V_{DD}$ is as follows:

$$I_{DD} = nI_T + I_7,$$

where n = number of output driver circuits on a chip.

It may be noted from the above discussion that output bipolar transistors 13 and 16 have there high conduction states controlled by the opposite polarity MOS transistors 18 and 19 and simultaneously have their low conduction states controlled by the opposite polarity bipolar input transistors 21 and 22. This design greatly reduces any power supply glitch current flowing through transistors 13 and 16 during the switching action and thereby enhances switching speed. Furthermore, bipolar transistors 13, 16, 21, and 22 are operated as emitter followers and therefore require no process steps for minimizing device collector-substrate capacitance.

By now it should be appreciated that there has been provided an output driver circuit having high input impedance and high output current drive with low static power dissipation that provides supply voltages and full logic output voltage swing for circuits having submicron dimensions.

We claim:

1. A driver circuit comprising:
   an input terminal receiving a digital input signal;
   an output terminal;
   a first supply voltage terminal for receiving a first supply voltage;
   a second supply voltage terminal for receiving a second supply voltage;
   a third supply voltage terminal;
   a fourth supply voltage terminal;
   first means coupled between said first and second supply voltage terminals for dividing the voltage difference between said first and second supply voltages and providing third and fourth supply voltages at said third and fourth supply voltage terminals, respectively;
   second means coupled between said third and fourth supply voltage terminals and to said input terminal for inverting said input signal;
   third means coupled between said first and second supply voltage terminals and to said output terminal for providing a digital output signal having an upper voltage swing substantially equal in magnitude to said third supply voltage and a lower voltage swing substantially equal in magnitude to said fourth supply voltage;
   fourth means coupled between said first and second supply voltage terminals and coupled to both said third means and said second means for biasing said third means in response to said inverted input signal; and
   fifth means coupled between said first and second supply voltage terminals and coupled to both said fourth means and said input terminal for sourcing current to said fourth means in response to said input signal, the magnitude of the current being proportional to the magnitude of said input signal.

2. The driver circuit according to claim 1 wherein said third means comprises a pair of complimentary push pull bipolar transistors having their emitters coupled to said output terminal, their collectors coupled to said first and second supply voltage terminals, respectively, and their bases coupled to said fourth means.

3. The driver circuit according to claim 2 wherein said second means comprises first complimentary MOS transistors having their sources coupled to said first and second supply voltage terminals, respectively, their drains coupled together for providing said inverted input signal, and their gates coupled to said input terminal.

4. The driver circuit according to claim 3 wherein said fourth means comprises complimentary bipolar transistors having their collectors coupled to said first and second supply voltage terminals, respectively, their emitters coupled to the bases of said pair of complimentary push-pull bipolar transistors, respectively, and their bases coupled to said drains of said first complimentary MOS transistors.

5. The driver circuit according to claim 4 wherein said fifth means comprises second complimentary MOS transistors having their sources coupled to said first and second supply voltage terminals, respectively, their drains coupled to the emitters of said second and first complimentary bipolar transistors, respectively, and their gates coupled to said input terminal.

6. A driver circuit comprising:
   a first voltage terminal;
   a second voltage terminal;
   an input terminal;
   an output terminal;
   a first bipolar transistor having its collector-emitter current path coupled between said first voltage terminal and said output terminal, and a base;
   a second bipolar transistor having its collector-emitter current path coupled between said output terminal and said second voltage terminal, and a base;
   first means coupled between said first and second voltage terminals and to said input terminal for inverting an input signal;
   second means coupled between said first and second voltage terminals and between said first means and said bases of said first and second bipolar transistors for biasing said first and second bipolar transistors in response to said inverted input signal wherein said second means comprises a third bipolar transistor having its collector-emitter current path coupled between said first voltage terminal and said base of said second bipolar transistor, and a base coupled to said first means and a four bipolar transistor having its collector-emitter path coupled between base of said second bipolar transistor and said second voltage terminal and a base coupled to said first means; and
   third means coupled between said first and second voltage terminals and to said second means for sourcing current thereto, the magnitude of the current being proportional to the magnitude of said input signal.

7. The drive circuit according to claim 6 further comprising fourth means coupled between said first and second voltage terminals for providing a supply voltage substantially equal in magnitude to the magnitude of the voltage swing of an output signal appearing on said output terminal.

8. The driver circuit according to claim 6 wherein said third means comprises:
   a first MOS transistor having its source-drain path coupled between said first voltage terminal and said base of said first bipolar transistor, and a gate coupled to said input terminal; and
   a second MOS transistor having its source-drain path coupled between said base of said second bipolar transistor and said second voltage terminal, and a gate coupled to said input terminal.

9. The driver circuit according to claim 8 further comprising fourth means coupled between said first and second voltage terminals for providing a supply voltage substantially equal in magnitude to the magnitude of the voltage swing of an output signal appearing on said output terminal.

10. A circuit comprising:
    a first voltage terminal;
    a second voltage terminal;
    an input terminal;

an output terminal;
a first bipolar transistor having a collector coupled to said first voltage terminal, an emitter coupled to said output terminal, and a base;
a second bipolar transistor having a collector coupled to said second voltage terminal, an emitter coupled to said output terminal, and a base;
a third bipolar transistor having a collector coupled to said first voltage terminal, an emitter coupled to said base of said second bipolar transistor, and a base;
a fourth bipolar transistor having a collector coupled to said second voltage terminal, an emitter coupled to said base of said first bipolar transistor, and a base;
a first MOS transistor having a source coupled to said first voltage terminal, a drain coupled to said emitter of said fourth bipolar transistor, and a gate coupled to said input terminal;
a second MOS transistor having a source coupled to said second voltage terminal, a drain coupled to said emitter of said third bipolar transistor, and a gate coupled to said input terminal; and
first means coupled between said first and second voltage terminals and between said input terminal and said bases of said third and fourth bipolar transistors for inverting said input signal and driving said third and fourth bipolar transistors.

11. The circuit according to claim 10 wherein said first means comprises:
a third MOS transistor having a source coupled to said first voltage terminal, a drain coupled to the bases of said third and fourth bipolar transistors, and a gate coupled to said input terminal; and
a fourth MOS transistor having a source coupled to said second voltage terminal, a drain coupled to the bases of said third and fourth bipolar transistors, and a gate coupled to said input terminal.

12. The circuit according to claim 10 further comprising:
a third voltage terminal;
a fourth voltage terminal;
second means coupled between said first voltage terminal and said third voltage terminal for setting the voltage magnitude on said third voltage terminal; and
third means coupled between said second voltage terminal and said fourth voltage terminal for setting the voltage magnitude on said fourth voltage terminal, wherein said inverter circuit is coupled between said third and fourth voltage terminals.

13. The circuit according to claim 12 wherein said first means comprises:
a third MOS transistor having a source coupled to said third voltage terminal, a drain coupled to the bases of said third and fourth bipolar transistors, and a gate coupled to said input terminal; and
a fourth MOS transistor having a source coupled to said fourth voltage terminal, a drain coupled to the bases of said third and fourth bipolar transistors, and a gate coupled to said input terminal.

14. A driver circuit comprising:
a first voltage terminal;
a second voltage terminal;
an input terminal for receiving an input signal;
an output terminal;
a first bipolar transistor having its collector-emitter path coupled between said first voltage terminal and said output terminal, and a base;
a second bipolar transistor having its collector-emitter current path coupled between said output terminal and said second voltage terminal, and a base;
means coupled between said first and second voltage terminals and to said input terminal for inverting said input signal;
a third bipolar transistor having its first voltage terminal and said base of said second bipolar transistor, and a base coupled to said second means for receiving said inverted input signal;
a fourth bipolar transistor having its collector-emitter current path coupled between said base of said second bipolar transistor and said second voltage terminal, and a base coupled to said means for receiving said inverted input signal;
a first MOS transistor having its source-drain path coupled between said first voltage terminal and said base of said first bipolar transistor, and a gate coupled to said input terminal; and
a second MOS transistor having its source-drain path coupled between said base of said second bipolar transistor and said second voltage terminal, and a gate coupled to said input terminal.

15. The driver circuit according to claim 1 wherein said fifth means comprises second complimentary MOS transistors having their sources coupled to said first and second supply voltage terminals, respectively, their drains coupled to the emitters of said second and first complimentary bipolar transistors, respectively, and their gates coupled to said input terminal.

* * * * *